(12) United States Patent
Fukunaga et al.

(10) Patent No.: US 7,101,242 B2
(45) Date of Patent: Sep. 5, 2006

(54) METHOD FOR MANUFACTURING LIGHT EMITTING DEVICE COMPRISING REFLECTIVE FILM

(75) Inventors: Takeshi Fukunaga, Kanagawa (JP); Junya Maruyama, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/896,028

(22) Filed: Jul. 22, 2004

(65) Prior Publication Data

US 2004/0259453 A1 Dec. 23, 2004

Related U.S. Application Data

(60) Continuation of application No. 10/370,739, filed on Feb. 24, 2003, now Pat. No. 6,768,260, which is a division of application No. 09/774,653, filed on Feb. 1, 2001, now Pat. No. 6,559,594.

(30) Foreign Application Priority Data

Feb. 3, 2000 (JP) ............................. 2000-026879

(51) Int. Cl.
*H01J 9/00* (2006.01)
(52) U.S. Cl. ........................................ 445/23; 445/25
(58) Field of Classification Search ............ 445/23–25, 445/50, 51; 313/504–512; 428/690
See application file for complete search history.

(56) References Cited

U.S. PATENT DOCUMENTS

| | | | |
|---|---|---|---|
| 4,667,128 A | 5/1987 | Kamijo et al. | |
| 5,079,483 A | 1/1992 | Sato | |
| 5,670,792 A | 9/1997 | Utsugi et al. | |
| 5,739,545 A | 4/1998 | Guha et al. | |
| 5,780,174 A * | 7/1998 | Tokito et al. | 428/690 |
| 5,804,918 A | 9/1998 | Yazawa et al. | |
| 5,841,230 A | 11/1998 | Ikoma et al. | |
| 5,896,006 A | 4/1999 | Kusaka et al. | |
| 5,910,706 A | 6/1999 | Stevens et al. | |
| 5,929,561 A | 7/1999 | Kawami et al. | |
| 6,140,766 A | 10/2000 | Okada et al. | |
| 6,320,322 B1 * | 11/2001 | Tanaka | 315/169.3 |
| 6,383,048 B1 | 5/2002 | Yang et al. | |
| 6,406,802 B1 | 6/2002 | Arai et al. | |
| 6,416,888 B1 | 7/2002 | Kawamura et al. | |

(Continued)

FOREIGN PATENT DOCUMENTS

JP 09-134788 5/1997

(Continued)

OTHER PUBLICATIONS

Shimoda et al., "26.3: Multicolor Pixel Patterning of Light-Emitting Polymers by Ink-Jet Printing," Seiko-Epson Corp., Suwa, Japan, SID, 1999, 4 pages, no month.

*Primary Examiner*—Joseph Williams

(74) *Attorney, Agent, or Firm*—Fish & Richardson P.C.

(57) ABSTRACT

To provide a bright and highly reliable light-emitting device. An anode (102), an EL layer (103), a cathode (104), and an auxiliary electrode (105) are formed sequentially in lamination on a reflecting electrode (101). Further, the anode (102), the cathode (104), and the auxiliary electrode (105) are either transparent or semi-transparent with respect to visible radiation. In such a structure, lights generated in the EL layer (103) are almost all irradiated to the side of the cathode (104), whereby an effect light emitting area of a pixel is drastically enhanced.

18 Claims, 9 Drawing Sheets

U.S. PATENT DOCUMENTS

| | | |
|---|---|---|
| 6,608,449 B1 | 8/2003 | Fukunaga |
| 6,784,457 B1 | 8/2004 | Yamazaki et al. |
| 6,831,408 B1 | 12/2004 | Hirano et al. |
| 2004/0032202 A1 | 2/2004 | Fukunaga |
| 2005/0040400 A1 | 2/2005 | Yamazaki et al. |
| 2006/0017380 A1 | 1/2006 | Fukunaga et al. |
| 2006/0038488 A1 | 2/2006 | Fukunaga et al. |

FOREIGN PATENT DOCUMENTS

| | | |
|---|---|---|
| JP | 11-339958 | 12/1999 |
| WO | WO 99/39393 | 8/1999 |

\* cited by examiner

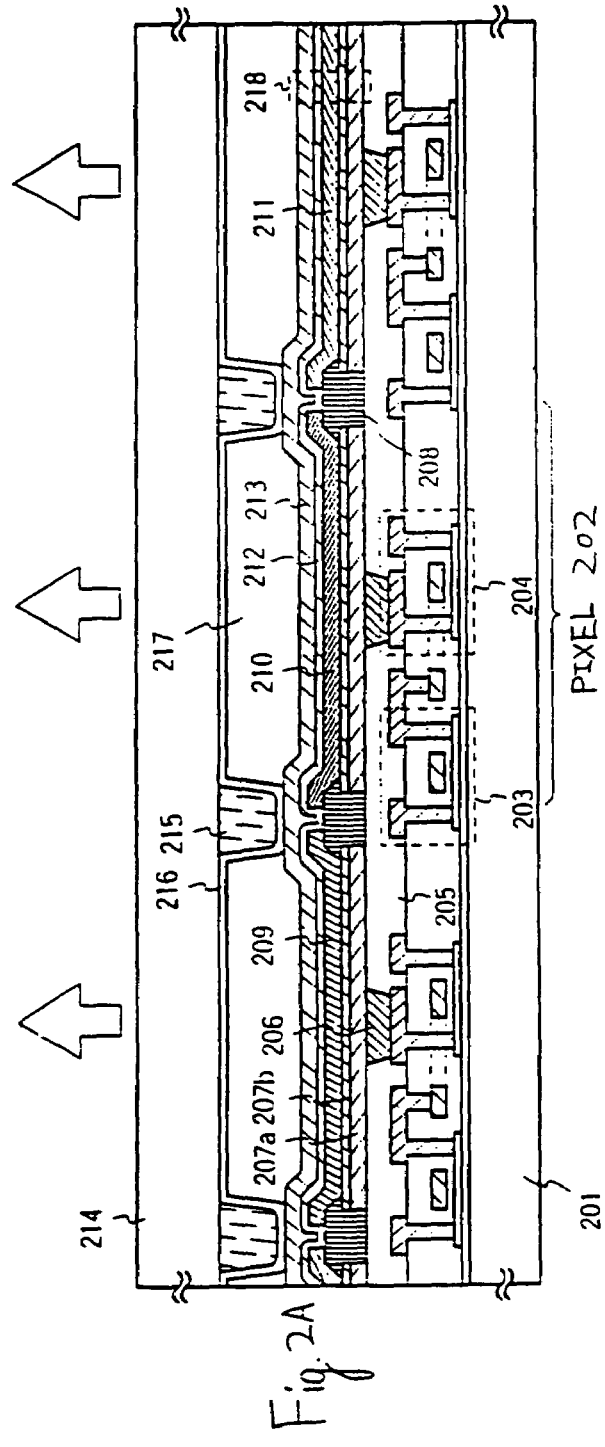
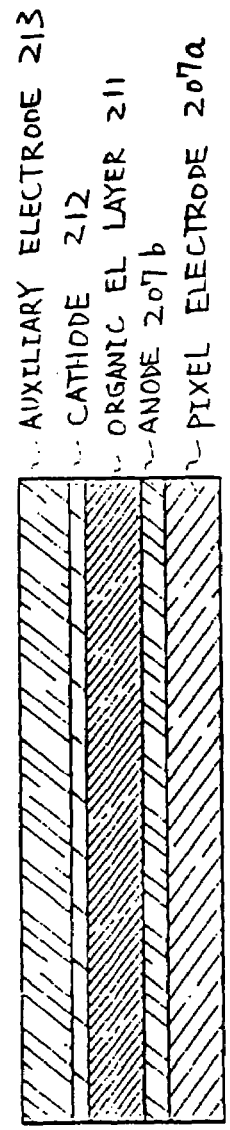

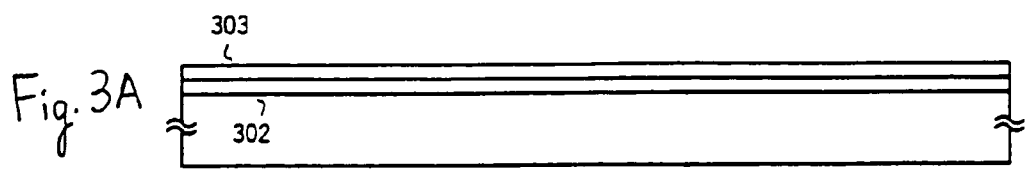
Fig. 3A
Fig. 3B
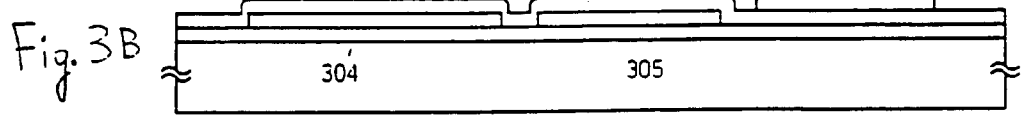
Fig. 3C
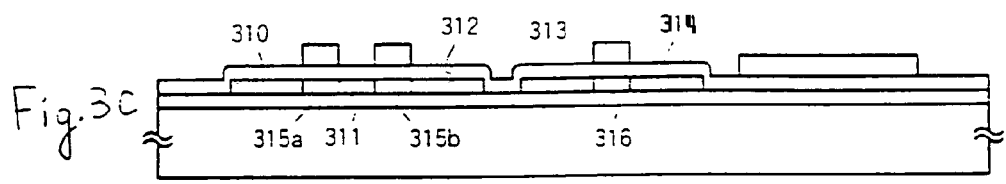
Fig. 3D
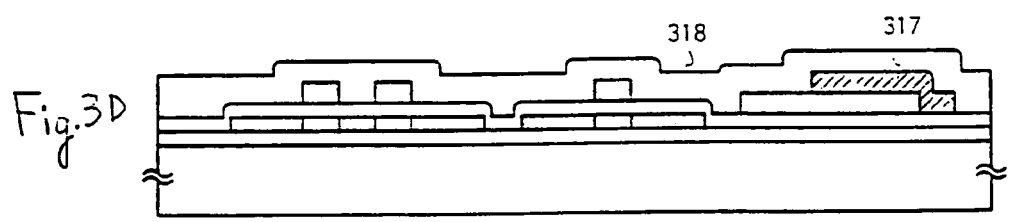
Fig. 3E
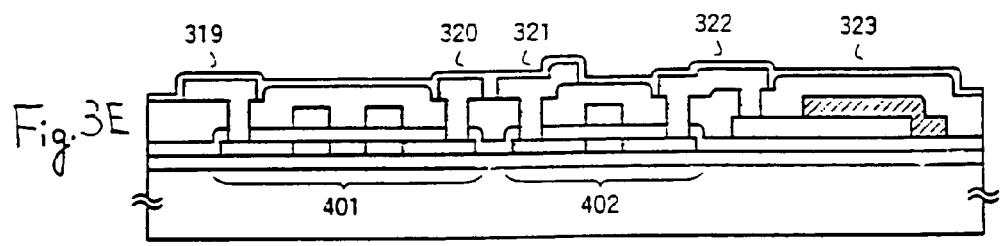

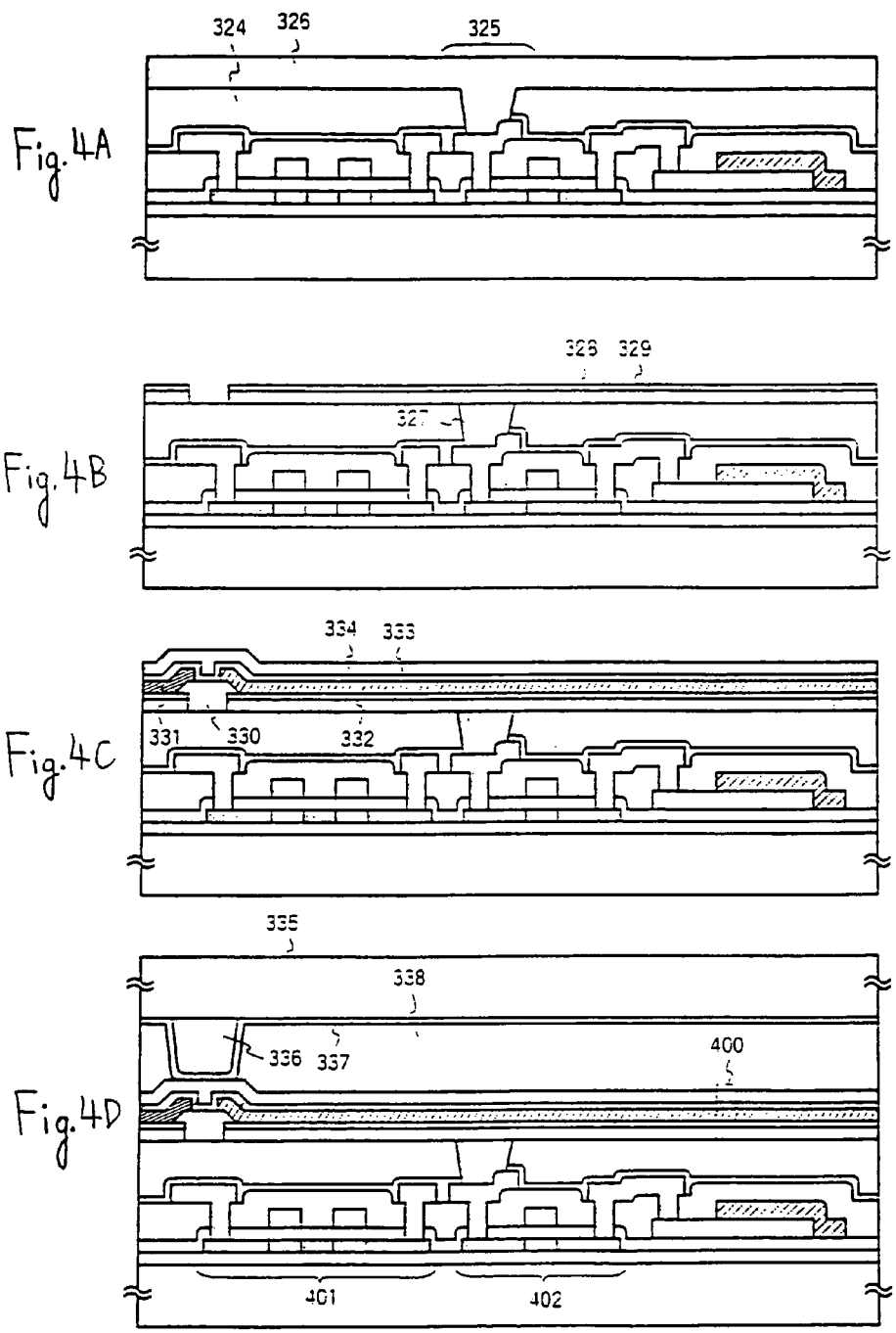

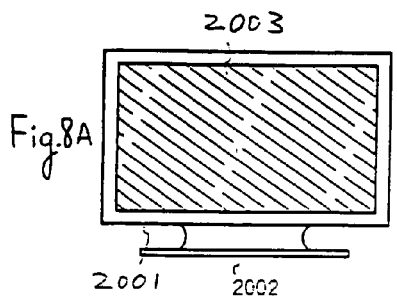
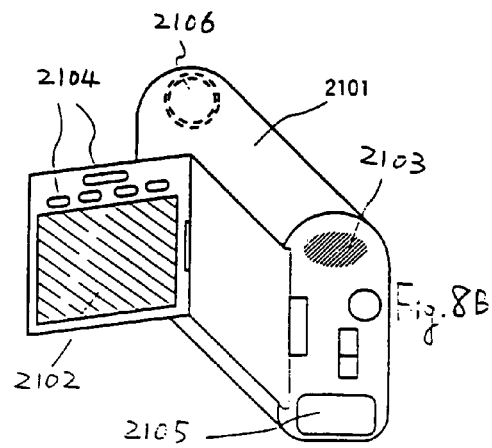
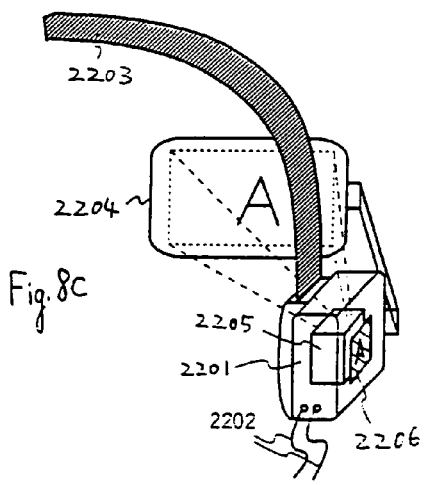
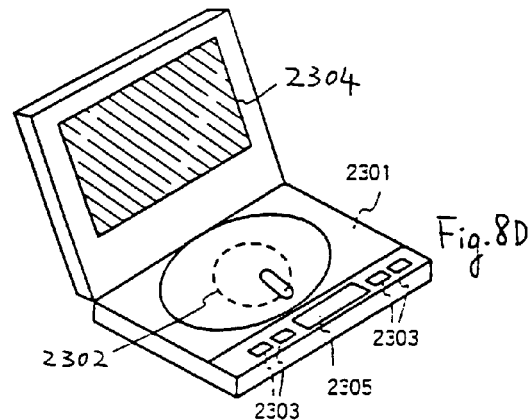
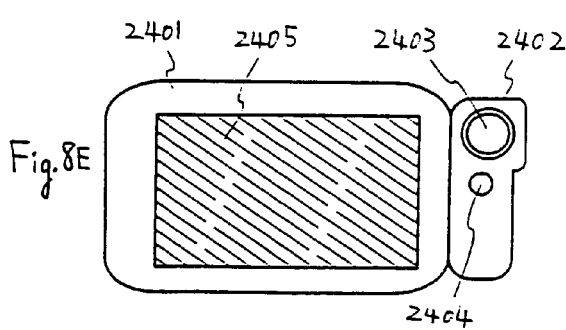
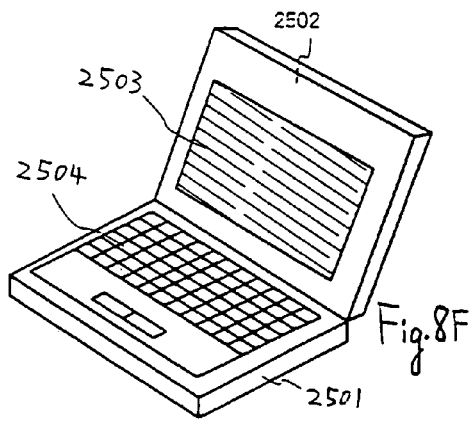

METHOD FOR MANUFACTURING LIGHT EMITTING DEVICE COMPRISING REFLECTIVE FILM

CROSS-REFERENCE TO RELATED APPLICATIONS

This application is a continuation application of U.S. application Ser. No. 10/370,739, filed Feb. 24, 2003 now U.S. Pat. No. 6,768,260, which is a divisional application of U.S. application Ser. No. 09/774,653, filed on Feb. 1, 2001, now U.S. Pat. No. 6,559,594, which claims the benefit of a foreign priority application filed in Japan as Serial No. 2000-026879 on Feb. 3, 2000. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a light-emitting device using a thin film that is made of a luminous material. Further, the present invention relates to electric equipment using the light-emitting device as a display portion or a light source.

2. Description of the Related Art

In recent years, development is proceeding in a light-emitting device (hereinafter referred to as an EL light-emitting device) employing a luminous element (hereinafter referred to as an EL element) that uses a thin film (hereinafter referred to as an EL film) made of a luminous material that provides EL (Electro Luminescence). The EL device is called a light emitting device or a light emitting diode or OLED (Organic Light Emission Diode). The EL (electroluminescent) devices referred to in this specification include triplet based light emission devices and/or singlet-based light emission devices, for example. The EL light-emitting device has an EL element that is composed of an anode, a cathode, and an EL film sandwiched therebetween. The emission of light can be attained from the EL light-emitting device by applying a voltage between the anode and the cathode. In particular, an organic film that is used as the EL film is referred to as an organic EL film. Note that a luminous material in which EL can be obtained includes a luminous material that luminesces via a singlet excitation and a luminous material that luminesces via a triplet excitation.

A metal that has a small work function (typically a metal belonging to Group 1 or Group 2 of the periodic table) is mostly used as the cathode, and a transparent oxide conductive film such as a compound film of indium oxide and tin oxide (ITO) is mostly used as the anode. Therefore, the emission of light attained is visible after the light is transmitted through the anode.

Recently, development is proceeding in an active matrix type EL light-emitting device in which the control of the emission of light by the EL elements provided in respective pixels is through the use of a TFT (thin film transistor), and the development thereof has reached a stage where trial products have been released. All these trial products use a pixel electrode as the anode, and hence the structures thereof are such that the light generated by the EL elements is irradiated to the side of the TFT.

However, because light is no transmitted to the regions where the TFTs and wirings are formed in such structures, a light emitting area (hereinafter referred to as an effect light emitting area) that can actually be seen is reduced drastically. Therefore, the necessity of raising the luminance of the light emitted in order to obtain a bright image leads to the result of hastening the deterioration of the organic EL film.

SUMMARY OF THE INVENTION

The present invention has been made in order to solve the above problem, and therefore has an object to provide a bright and highly reliable light-emitting device. Further, another object of the present invention is to provide highly reliable electric equipment that uses the light-emitting device as its display portion or light source.

The present invention is characterized in the employment of an EL element 100 having a structure shown in FIG. 1. In FIG. 1, reference numeral 101 denotes a reflecting electrode that is made of a metallic film. It is preferable that a metallic film that has a high reflectance is used as the reflecting electrode 101. An aluminum film (aluminum alloy film or an aluminum film containing a dopant) or a silver thin film may be used. In addition, the conductive film performed by aluminum plating or silver plating may also be used as the reflecting electrode 101.

Next, reference numeral 102 denotes an anode of the EL element 100 which is made of a transparent conductive film (hereinafter referred to as a transparent conductive film) with respect to visible radiation. It is to be noted that transparency with respect to the visible radiation (light of visible radiation region) indicates that the visible radiation transmits at a transmittance of between 80% and 100%. In case of using an oxide conductive film (typically a compound film of indium oxide and tin oxide or a compound film of indium oxide and zinc oxide) as the transparent conductive film, it is preferable that the film thickness thereof is formed between 10 and 200 nm (preferably between 50 and 100 nm).

At this point, a work function of the anode 102 determines a hole injection barrier, and the reflecting electrode 101 reflects the light emitted from the EL element and applies a uniform voltage to the anode 102 at the same time.

Next, reference numeral 103 denotes an EL layer. The EL layer 103 includes an EL film that has a single layer or multiple layers. It is to be noted that the EL film may be an organic EL film or an inorganic EL film, or it may be formed by laminating those films. Further, the structure of the EL layer 103 may be any known structure. In other words, throughout this specification, the EL layer is a layer formed by freely combining an electron injection layer, an electron transport layer, and an EL film (also referred as a light-emitting layer). Of course, the EL film maybe a low molecular weight or a high molecular weight film.

Reference numeral 104 denotes a cathode of the EL element 100. A metallic film having a small work function (about −3.5 to −3.8 eV) is used as the cathode 104. A metallic film containing an element that belongs to Group 1 or Group 2 of the periodic table may be used as the metallic film having such a work function. Therefore, in the present invention, it is desirable that a 10 to 70 nm thick (preferably between 20 and 50 nm) metallic film containing an element that belongs to Group 1 or Group 2 of the periodic table is used as the cathode 104.

Visible radiation can be transmitted through such a metallic film as the above, which has a thin film thickness. Thus, the cathode 104 can be used as a transparent electrode to visible radiation.

Next, reference numeral 105 denotes an electrode, which is made of the transparent conductive film, in contact with the cathode (hereinafter referred to as an auxiliary electrode). An oxide conductive film typified by a compound film of indium oxide and tin oxide or a compound film of indium oxide and zinc oxide may be used as the auxiliary electrode 105. The film thickness thereof may be formed to between 10 and 200 nm (preferably between 50 and 100 nm). At this point, a work function of the cathode 104 determines the hole injection barrier, and the auxiliary electrode 105 applies a uniform voltage to the cathode 104.

When the EL element has the above-described structure, the light generated at the EL layer (strictly the EL film contained in the EL layer) can be observed from the side of the auxiliary electrode 105 (the upper direction in FIG. 1). This fact can be easily comprehended by considering that the light advancing to the side of the anode 102 is mostly reflected by the reflecting electrode 101.

An effect of the present invention is in that the extraction of the emission of light of the EL light-emitting device from the side of the cathode, which in the prior art had been difficult, can now be carried out with ease. This effect is particularly remarkable during the formation of the active matrix type EL light-emitting device.

BRIEF DESCRIPTION OF THE DRAWINGS

In the accompanying drawings:

FIGS. 2A and 2B are diagrams showing cross-sectional structures of a light-emitting device;

FIGS. 3A to 3E are diagrams showing a process of manufacturing the light-emitting device;

FIGS. 4A to 4D are diagrams showing the process of manufacturing the light-emitting device.;

FIGS. 8A to 8F are diagrams showing specific examples of electronic equipments.

DETAILED DESCRIPTION OF THE PREFERRED EMBODIMENTS

Figure 1:
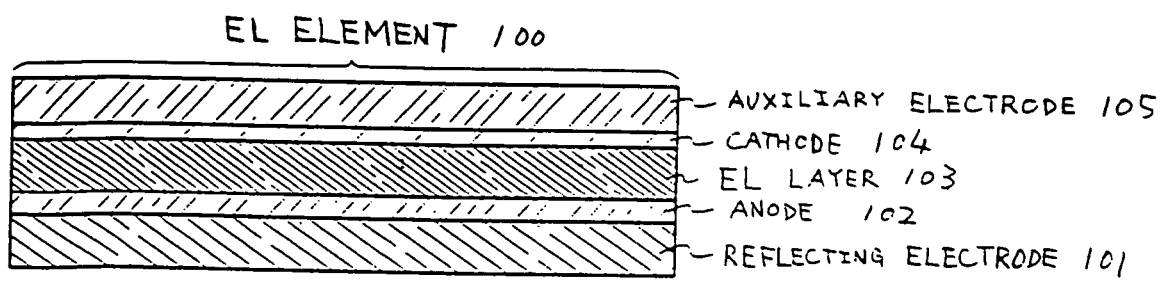
FIG. 1 is a diagram showing a cross sectional structure of an EL element.

An embodiment mode of the present invention will be explained with reference to FIGS. 2A and 2B. In FIG. 2A, reference numeral 201 denotes a substrate on which an element is formed (hereinafter referred to as an element-forming substrate). In the present invention, any material may be used as the substrate. Glass (including quartz glass), crystallized glass, single crystal silicon, ceramic, metal, or plastic may be used as the substrate.

A pixel 202 is formed on the element-forming substrate 201, and the pixel 202 includes a switching TFT 203 and a current control TFT 204. Note that three pixels corresponding to each of the colors red, green, and blue are illustrated in FIG. 2A. The switching TFT 203 functions as a switch for taking a video signal into the pixels, and the current control TFT 204 functions as a switch for controlling a current flowing to an EL element. At this point, a drain of the switching TFT 203 is electrically connected to a gate of the current control TFT 204.

There is no limit placed on the structures of the switching TFT 203 and the current control TFT 204, but the structures thereof may be a top gate type (typically a planar type) or a bottom gate type (typically an inverted stagger type). In addition, an N channel TFT or a P channel TFT may be used to form both the switching TFT 203 and the current control TFT 204.

The switching TFT 203 and the current control TFT 204 are covered by an interlayer insulating film 205, and on the top thereof, a drain of the current control TFT 204 and a pixel electrode 207a are electrically connected via a conductor 206. Further, an anode 207b made of a transparent conductive film is laminated on the pixel electrode 207a (corresponding to the reflecting electrode 101 of FIG. 1). It is to be noted that resin that has conductivity by dispersing metallic particles therein (typically an anisotropic conductive film) may be used as the conductor 206. Of course, the pixel electrode 207a may be directly connected to the drain of the current control TFT 204.

In the embodiment mode, a concave portion that originates in a contact hole will not be formed in the pixel electrode 207a by employing the conductor 206. Such a concave portion can also be a cause of the deterioration of the organic EL layer, and hence is not preferred. That is, the pixel electrode 207a is leveled by employing the conductor 206 as in the embodiment mode, thereby being capable of suppressing the deterioration of the organic EL layer and obtaining a uniform emission of light.

Next, reference numeral 208 denotes an insulating film provided in a gap between the adjacent pixel electrodes 207a. The insulating film 208 is formed so as to cover a step that is formed at the edge portion of the pixel electrode 207a. By keeping the organic EL layer at a distance from the edge portion of the pixel electrode 207a, the insulating film 208 has an effect of suppressing the influence of an electric field concentration in the edge portion of the pixel electrode 207a.

Note that the insulating film 208 is referred to as a bank throughout this specification. Resin, a silicon oxide film, a silicon nitride film, or a silicon nitride oxide film can be used as the bank 208. In particular, resin has a low relative dielectric constant, and therefore is effective in suppressing the electric field concentration in the edge portion of the pixel electrode 207a.

Reference numeral 209 denotes an organic EL layer luminescing red color, reference numeral 210 denotes an organic EL layer luminescing green color, and reference numeral 211 denotes an organic EL layer luminescing blue color. The structure of the organic EL layers 209 to 211 may be known structures. As in the embodiment mode, in case of forming the organic EL layers separately for each pixel, the evaporation method is preferably performed.

A cathode 212, which is provided covering the organic EL layers 209 to 211, is an alloy film made of evaporating both aluminum and lithium together (hereinafter referred to as an Al—Li film). The film thickness thereof is formed to between 10 and 70 nm (typically between 20 and 50 nm). In addition, an auxiliary electrode 213 formed to a thickness of between 10 and 200 nm (preferably between 50 and 100 nm) is provided thereon.

Further, a substrate 214 that is provided in opposition to the element-forming substrate (hereinafter referred to as an opposing substrate) has a spacer 215 made of resin and a passivation film 216 which are formed thereon. The opposing substrate 214 is bonded to the element-forming substrate 201 by a sealing member (not shown in the figure). The height of the spacer 215 is not particularly limited, but the height maybe between 1 and 3 μm. Also, as the passivation film 216, it is preferable to use an insulating film having a high transmittance to suppress degas from the spacer 215. For instance, a silicon nitride film, a silicon nitride oxide film, a tantalum oxide film, or a carbon film (preferably a diamond like carbon film) may be used.

It is further preferable to fill a space 217 that is formed between the element-forming substrate 210 and the opposing substrate 214 with nitrogen gas or noble gas. It is desirable that an absorbent (substance having absorbency) is provided in the space 217 and moisture, oxygen, or gas generated from the resin is preferably absorbed.

The detailed structure of the EL element 218 thus formed is shown in FIG. 2B. The pixel electrode 207*a* also serves as the reflecting electrode, and therefore the structure of the EL element 218 is similar to the structure of the EL element of the present invention shown in FIG. 1.

By adopting the structure shown in the embodiment mode of the present invention, the emission of light generated by the EL element 218 is irradiated towards the direction indicated by the arrow (a direction indicating the irradiation direction of light). Therefore, even if the area of the TFT and the wiring included in the pixel is large, the effect light emitting area is prescribed by the area of the pixel electrode 207*a*, making it possible to secure a sufficiently large area. In other words, a satisfactorily bright image can be attained without raising the luminance of the emitted light.

This means that the driving voltage of the EL element is set at a low level to reduce the consumption power of the EL light-emitting device. Further, this means that the driving voltage of the EL element is similarly set at a low level to suppress the deterioration of the organic EL layer, thereby raising the reliability of the EL light-emitting device.

Embodiment 1

Figure 5A:
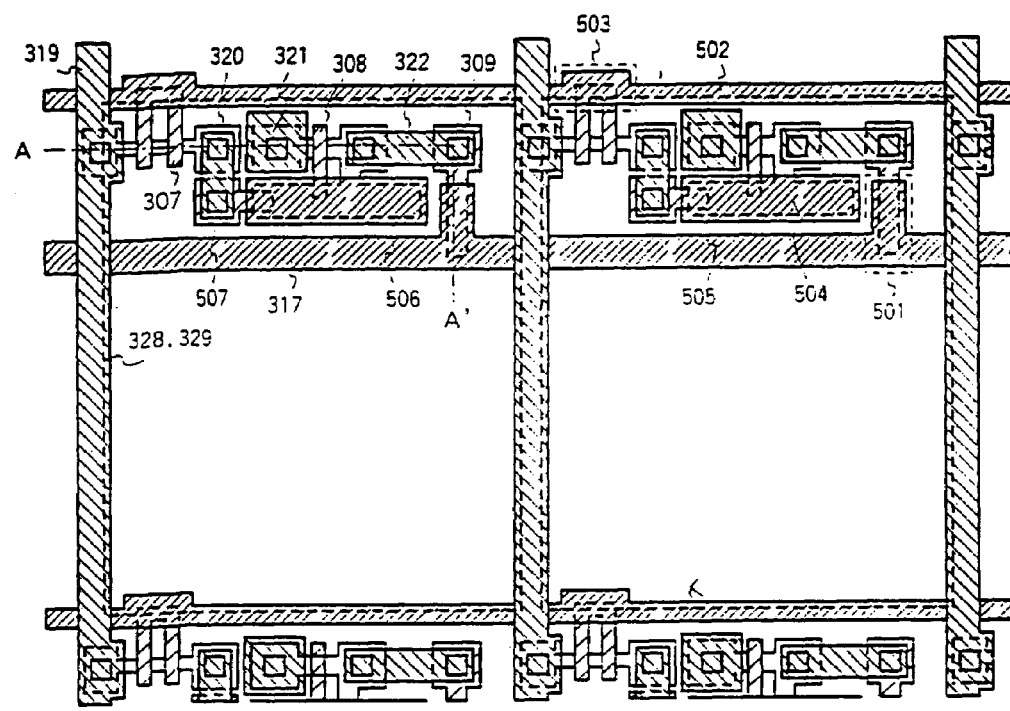
FIGS. 5A and 5B are diagrams showing a top structure and a circuit configuration of a pixel of the light-emitting device.
Figure 5B:
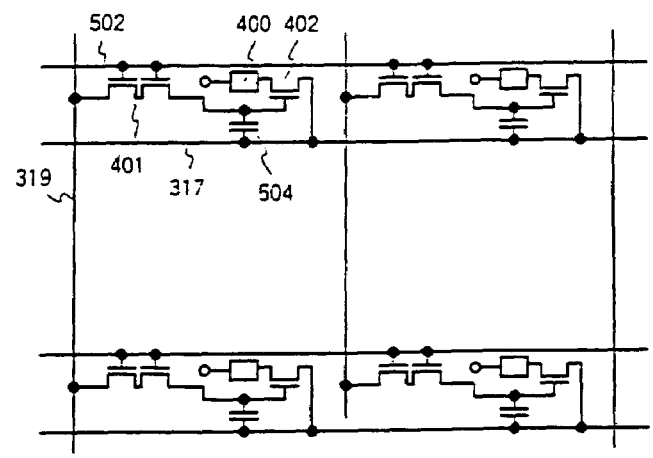

Embodiment 1 will be explained with reference to FIGS. 3A to 5B. Note that shown in FIGS. 3A to 4D are cross sectional views of manufacturing processes in a pixel portion. Furthermore, the top view of a pixel formed in accordance with Embodiment 1 (a top view at the point of the formation of an anode) is shown in FIG. 5A, and a final circuit configuration of the pixel is shown in FIG. 5B. It is to be noted that the reference numerals used in FIGS. 5A and 5B correspond to those used in FIGS. 3A to 4D.

First, as shown in FIG. 3A, a glass substrate 301 is prepared as the element-forming substrate, and an insulating film 302 made of a silicon oxide film is formed thereon to a thickness of 200 nm. The insulating film 302 may be formed by employing low pressure thermal CVD, plasma CVD, sputtering, or evaporation.

A crystalline silicon film 303 is next formed to a thickness of 50 nm on the insulating film 302. A known method may be used as the formation method of the crystalline silicon film 303. An amorphous silicon film may be crystallized into the crystalline silicon film 103 by using a solid laser or an excimer laser, or the amorphous silicon film may be crystallized by performing heat treatment (furnace annealing). In Embodiment 1, the amorphous silicon film is crystallized by irradiating by means of excimer laser using XeCl gas.

Next, as shown in FIG. 3B, the crystalline silicon film 303 is patterned to thereby form island-like crystalline silicon films 304 and 305 (hereinafter referred to as active layers). Then a gate insulating film 306 made of a silicon oxide film is formed to a thickness of 80 nm so as to cover the active layers. Gate electrodes 307 and 308 are further formed on the gate insulating film 306. As a material of the gate electrodes 307 and 308 in Embodiment 1, a 350 nm thick tungsten film or a tungsten alloy film is used. Of course, other known materials can be used as the material of the gate electrodes.

Note that in Embodiment 1, a connecting wiring 309 is formed simultaneously at this point. The connecting wiring 309 is a wiring for electrically connecting a source of the current control TFT and a current supply line later.

As shown in FIG. 3C next, using the gate electrodes 307 and 308 as masks, an element (typically boron) that belongs to Group 13 of the periodic table is doped. A known doping method may be used. Thus, impurity regions (hereinafter referred to as p-type impurity regions) 310 to 314 which indicate p-type conductivity are formed. Further, channel forming regions 315*a*, 315*b*, and 316 are demarcated right under the gate electrodes. Note that the p-type impurity regions 310 to 314 become a source region or a drain region of a TFT.

The doped element that belongs to Group 13 of the periodic table, which is doped, is activated by performing heat treatment. This activation process is performed by furnace annealing, laser annealing, or lamp annealing, or may be performed by a combination thereof. In Embodiment 1, the heat treatment is conducted under a nitrogen atmosphere at a temperature of 500° C. for 4 hours.

However, it is preferable to set the oxygen concentration in the treatment atmosphere of the activation process to 1 ppm or less (preferably 0.1 ppm or less). If the oxygen concentration is high, the surfaces of the gate electrodes 307 and 308 and the surface of the connecting wiring 309 will be oxidized. As a result, it will become difficult to obtain an electrical connection to a gate wiring and a current supply line, which will be formed in a later process.

Note that it is effective to perform a hydrogenation treatment after completing the activation process. The known hydrogen annealing technique or the plasma hydrogenation technique may be used in the hydrogenation treatment.

As shown in FIG. 3D, a current supply line 317 is formed so as to contact the connecting wiring 309. By forming such a structure (the top view thereof is indicated by a region denoted by reference numeral 501 in FIG. 5A), the connecting wiring 309 and the current supply line 317 are electrically connected to each other. Note that although not shown in the figure, a gate wiring (wiring denoted by reference numeral 502 in FIG. 5A) is formed simultaneously at this point to thereby be electrically connected to a gate electrode 307. The top view thereof is indicated by a region denoted by reference numeral 503 in FIG. 5A.

In the region denoted by reference numeral 503, a design is made redundant such that a gate wiring 502 has a convex portion in order to secure a part that does not override the gate electrode 307. By adopting such a structure, even if the gate wiring 502 is cut at the part where it overrides the gate electrode 307, electrically cutting the gate wiring 502 at that point can be prevented. In addition, the structure such that the gate electrode 307 is processed into a U-shape is a redundant design for the purpose of applying a voltage to both the gate electrodes without fail.

The current supply line 317 and the gate wiring 502 are made of a metallic film that has a lower resistance than that of the metallic film forming the connecting wiring 309 and the gate electrode 307. A metallic film containing aluminum, copper, or silver is preferably used. That is, a metallic film having a high workability is used for forming a gate electrode that demands fine patterning accuracy, and a metallic film having a low resistance is used for forming a bus line (gate wiring and current supply line in Embodiment 1) that demands a low resistivity.

Upon formation of the gate wiring 502 and the current supply line 309, a first interlayer insulating film 318 made of a silicon oxide film is formed to a thickness of 800 nm. Plasma CVD may be employed as the formation method thereof. Other inorganic insulating films may be used as the first interlayer insulating film 318, or resin (organic insulating film) may be used.

As shown in FIG. 3E next, a contact hole is formed in the first interlayer insulating film 318 to thereby form wirings 319 to 322. In Embodiment 1, a metallic wiring made of a three-layered structure of titanium, aluminum, and titanium is used as the wirings 319 to 322. Of course., any material may be used as long as it is a conductive film. The wirings 319 to 322 become source wirings or drain wirings of the TFT.

The drain wiring 322 of the current control TFT is electrically connected to the connecting wiring 309. As a result, the drain of a current control TFT 402 is electrically connected to the current supply line 317.

A switching TFT 401 and the current control TFT (EL driving TFT) 402 are thus completed in this state. Both the TFTs are formed of a P channel TFT in Embodiment 1. However, the switching TFT 401 is formed such that the gate electrodes cut across the active layers in two places, resulting in forming a structure in which two channel forming regions are connected in series. By forming such a structure, an OFF current value (a current that flows when the TFT is turned OFF) can be effectively suppressed.

As shown in FIG. 5A, a storage capacitor 504 is further formed in the pixel. The storage capacitor 504 is composed of a semiconductor layer 505 that is electrically connected to the drain of the current control TFT 402, the gate insulating film 306, and a capacitor wiring 506. The capacitor wiring 506 is formed at the same time as the gate wiring 502 and the current supply line 317, and also serves as a wiring for electrically connecting the gate electrode 308 and a connecting wiring 507. It is to be noted that the connecting wiring 507 is electrically connected to the drain wiring (in some cases, functioning as a source wiring) 320 of the switching TFT 401.

Upon formation of the wirings 319 to 322, a passivation film 323 made of a silicon nitride film or a silicon nitride oxide film is formed to a thickness of 200 nm. A hydrogenation treatment either before or after forming the passivation film 323 is performed, thereby being capable of improving the electric characteristic of the TFTs.

As shown in FIG. 4A, a second interlayer insulating film 324 made of acrylic is formed to a thickness of 1 μm. After opening a contact hole 325, an anisotropic conductive film 326 is formed. In Embodiment 1, acrylic having silver particles dispersed therein is used as the anisotropic conductive film 326. In addition, it is preferable to form the anisotropic conductive film 326 to about a thickness that is thick enough to level the contact hole 325. The anisotropic conductive film 326 is formed to a thickness of 1.5 μm by spin coating in Embodiment 1.

Next, the anisotropic conductive film 326 is etched by plasma employing oxygen gas. This process is continued until the second interlayer insulating film 324 is exposed. When the etching process is completed, a conductor 327 is formed to have a shape shown in FIG. 4B.

Upon formation of the conductor 327, an aluminum film doped with scandium or titanium and an ITO film (compound film of indium oxide and tin oxide) are laminated thereon. Then the films are etched together to form a pixel electrode 328 and an anode 329. In Embodiment 1, the aluminum film is formed to have a thickness of 200 nm, and the ITO film is formed to a thickness of 100 nm. Further, the ITO film may be etched with ITO-04N (product name of an ITO film etching solution manufactured by Kanto Chemistry Inc.), and the aluminum film may be etched by a dry etching method employing a mixed gas of carbon tetrachloride ($SiCl_4$) and chlorine ($Cl_2$).

The cross-sectional structure of FIG. 4B thus obtained corresponds to the cross-sectional structure taken along the line A–A' in FIG. 5A.

As shown in FIG. 4C, a bank 330 made of an insulating film is formed next. In Embodiment 1, acrylic is used to form the bank 330. However, a silicon oxide film may be used to form the bank 330. Upon formation of the bank 330, ultraviolet light is irradiated to the anode 329 under an oxygen atmosphere to thereby perform surface treatment thereof. This process has an effect of increasing the work function of the anode 329, and has a further effect of removing the contaminations on the surface of the anode 329.

Then organic EL layers 331 and 332 are each formed to have a thickness of 50 nm. Note that the organic EL layer 331 is an organic EL layer luminescing blue color and that the organic EL layer 332 is an organic EL layer luminescing red color. Note that although not shown in the figure, an organic EL layer luminescing green color is formed at the same time. In Embodiment 1, the organic EL layers for each pixel are formed separately by the evaporation method that employs a shadow mask. Of course, the organic EL layers may be formed separately by using the printing method and the ink jet method.

The organic EL layers 331 and 332 are formed to have a lamination structure in Embodiment 1. To be more specific, CuPc (Copper Phthalocyanine) is used as a hole injection layer. In this case, a copper phthalocyanine film is first formed on all the pixels. Thereafter, a light-emitting layer luminescing red color, a light-emitting layer luminescing green color, and a light-emitting layer luminescing blue color, respectively, are formed thereon to each of the pixels corresponding to the colors red, green, and blue.

It is to be noted that when forming the light-emitting layer luminescing green color, $Alq_3$ (tris-8-quinolilite-aluminum complex) is used as the core material of the light-emitting layer, and quinacridon or coumarin 6 is doped as the dopant. Further, when forming the light-emitting layer luminescing red color, $Alq_3$ is used as the core material of the light-emitting layer, and DCJT, DCM1, or DCM2 is doped as the dopant. When forming the light-emitting layer luminescing blue color, $BAlq_3$ (a 5 ligand complex having 2-methyl-8-quinolinol and a mixed ligand of a phenol conductor) is used as the core material of the light-emitting layer, and perylene is doped as the dopant.

Of course, the present invention is not necessarily limited to the above organic materials, and known low molecular weight organic EL materials, high molecular weight organic EL materials, and inorganic EL materials may be used. In case of using a high molecular weight organic EL material, an application method can also be employed.

Upon forming the organic EL layers 331 and 332 in accordance with the above steps, an MgAg film (metallic film in which 1% to 10% of silver (Ag) is doped into magnesium (Mg)) is formed to have a thickness of 20 nm as a cathode 333. An ITO film is further formed to have a thickness of 150 nm as an auxiliary electrode 334. An EL element 400 that is composed of the anode 329, the organic EL layer 332, and the cathode 333 is thus formed. In Embodiment 1, the EL element 400 functions as a luminous element.

Next, as shown in FIG. 4D, a spacer 336 made of resin and an opposing side passivation film 337 made of a tantalum oxide film or a diamond like carbon film are formed on an opposing substrate 335. Then, the element-forming substrate 301 and the opposing substrate 335 are bonded together by using a sealing member not shown in the figure. The opposing side passivation film 337 has an effect of preventing degas from the spacer 336 made of resin. Note that in Embodiment 1, the substrate that includes the elements formed thereon is referred to as the element-forming substrate. Furthermore, the substrate that includes the spacer and the opposing side passivation film formed thereon is referred to as the opposing substrate.

It is to be noted that the bonding process of both the substrates is performed under an argon atmosphere. As a result, a space 338 is filled with argon. Of course, inert gas such as nitrogen gas or noble gas may be used as the gas to be filled in the space 338. In addition, it is preferable to provide a material that absorbs oxygen or moisture in the space 338. Further, instead of leaving the space 338 empty as a space, resin may be filled therein.

The switching TFT (P channel TFT in Embodiment 1) 401 and the current control TFT (P channel TFT in Embodiment 1) 402 are thus formed in the pixel in accordance with the manufacturing processes shown above. In Embodiment 1, because all the TFTs are formed of the P channel TFT, the manufacturing processes are extremely simple and easy. Of course, an N channel TFT may be used as the switching TFT and/or the current control TFT. A known technique may be employed to manufacture the N channel TFT and the structure thereof is not particularly limited.

The leveling of steps is performed by the second interlayer insulating film 324. Further, because the drain wiring 321 of the current control TFT 402 and the pixel electrode 328 are electrically connected to each other by using the conductor 327 filling the contact hole 325, the pixel electrode 328 has a high flatness. Therefore, the emission of light from the pixels can be made uniform since the uniformity of the film thickness of the organic EL layer 332 can be enhanced.

The principal characteristic of the present invention is in that light emitted from the EL element 400 is irradiated in the direction toward the side of the opposing substrate 335. Thus, almost the entire area of the pixels becomes the effect light emitting area, and the area of the pixel electrode 328 substantially determines the effect light emitting area. Therefore, it becomes possible to realize a high aperture ratio of 80 to 95%.

Embodiment 2

Figure 6:
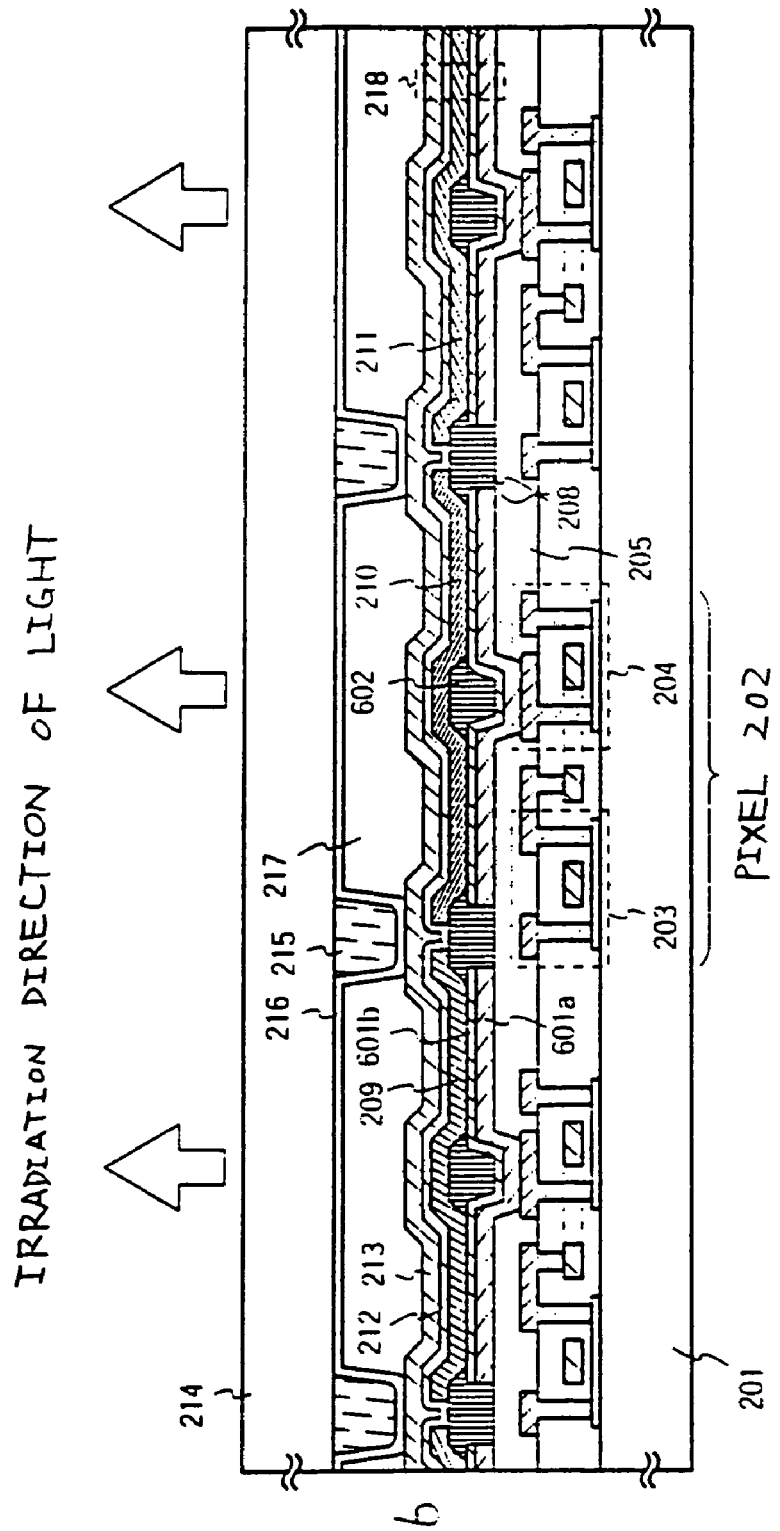
FIG. 6 is a diagram showing a cross-sectional structure of the light-emitting device.

In Embodiment 2, an explanation will be made with reference to FIG. 6 on an EL light-emitting device having a pixel with a structure that is different from that of the EL light-emitting device shown in FIG. 2. Note that in Embodiment 2, the structure of the EL light-emitting device may be manufactured by adding a few changes to the structure of FIG. 2, and hence explanations will be made on the points that are different from those of FIG. 2. Therefore, the embodiment mode may be referenced concerning the explanation of the parts that are denoted by the same reference numerals with those of FIG. 2.

In Embodiment 2, upon forming a contact hole in the interlayer insulating film 205, a pixel electrode 601a and an anode 601b are formed in this state. Then, an insulating film 602 is formed to fill up the concave portion formed by the contact hole. The insulating film 602 is called a filling-up insulating film in Embodiment 2. The filling-up insulating film 602 can be formed at the same time with the bank 208 so that any particular process does not have to be added to the manufacturing processes.

Similar to the conductor 206 of FIG. 2, the filling-up insulating film 602 is a film for suppressing the deterioration of the organic EL layer which originates at the concave portion caused by the contact hole. At this point, it is preferable to set the height between the top of the filling-up insulating film 602 and the anode 601b to between 100 and 300 nm. If the height exceeds 300 nm, a step is formed and there are cases where this step becomes a cause of promoting the deterioration of the organic EL layer. Further, if the height is less than 100 nm, there is a concern that the effect of the bank 208 (the effect of suppressing the influence of the electric field concentration in the edge portion of the pixel electrode), which is formed at the same time, is reduced.

After the formation of the anode 601a, an acrylic film is formed to have a thickness of 500 nm by spin coating in Embodiment 2. Then, oxygen gas is formed into plasma to thereby perform etching to the acrylic film until the film thickness thereof (only the film thickness outside the contact hole) reaches 200 nm. Thus, after making the film thickness of the acrylic film thin, patterning is performed to form the bank 208 and the filling-up insulating film 602.

Figure 7:
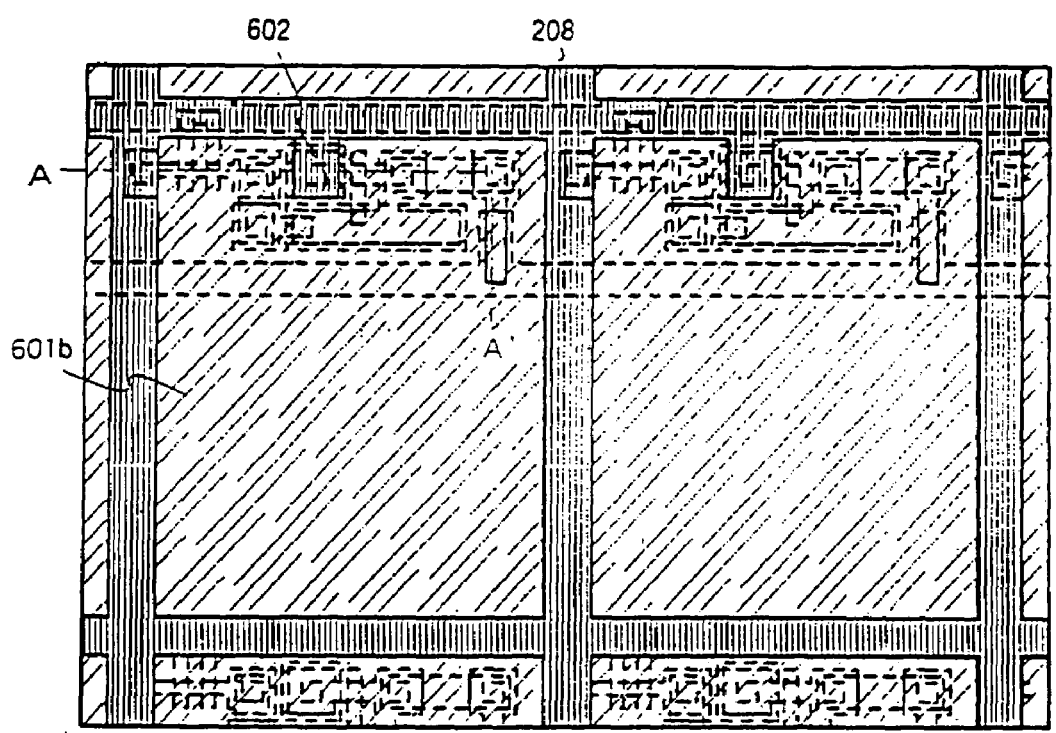
FIG. 7 is a diagram showing a top structure of the light-emitting device.

A top structure of the pixel in Embodiment 2 is shown here in FIG. 7. The cross-sectional view taken along the line A–A' of FIG. 7 corresponds to FIG. 6. Note that the opposing substrate 214 and the spacer 215 are not shown in FIG. 7. In addition, the basic structure of the pixel is the same as that of FIG. 5, and therefore the detail explanation thereof is omitted.

In FIG. 7, the bank 208 is formed so as to hide the step at the edge portion of the pixel electrode 601a and the anode 601b. The filling-up insulating film 602 is formed such that a portion of the bank 208 is protruding. Thus, a structure may be such that the protruding insulating film fills up the concave portion formed by the contact hole of the pixel electrode 601a.

Note that the EL light-emitting device of Embodiment 2 can be readily manufactured by combining the above-mentioned formation method of the filling-up insulating film to the manufacturing method of Embodiment 1.

Embodiment 3

Although only the structure of the pixel portion is shown in the EL light-emitting device illustrated in Embodiment 1, a driver circuit for driving the pixel portion may be formed integrally therewith on the same substrate. When forming the driver circuit, the driver circuit may be formed of an nMOS circuit, a pMOS circuit, or a CMOS circuit. Of course, only the pixel portion may be formed of a TFT, and a driver circuit containing an IC chip may be used as an external-attached driver circuit.

Further, the manufacturing processes in Embodiment 1 are reduced by forming the pixel portion with the P channel TFT only. However, in case of Embodiment 2, the driver circuit is formed of the pMOS circuit, and a driver circuit containing an IC chip can be used as the driver circuit that cannot be formed of the pMOS circuit.

Note that the constitution of Embodiment 2 may be implemented by freely combining it with the constitution of Embodiment 1 or 2.

Embodiment 4

In Embodiment 4, an explanation will be made on an example where an amorphous silicon film is used as an active layer of a switching TFT and a current control TFT that are to be formed in the pixel portion. An inverted stagger type TFT is known as the TFT using an amorphous silicon film. Such a TFT is used in Embodiment 4.

The manufacturing process of the TFT using an amorphous silicon film is simple and easy, on the other hand, it has a drawback in that the size of an element is made large. However, in the EL light-emitting device of the present invention, the size of the TFT has no influence on the effect light emitting area of the pixel. Therefore, a more inexpensive EL light-emitting device can be manufactured by using an amorphous silicon film as the active layer of the TFT.

Note that the constitution of Embodiment 4 may be implemented by freely combining it with any of the constitutions of Embodiments 1 to 3. However, in case of combining the constitution of Embodiment 4 with that of Embodiment 3, it is preferable to externally attach the driver circuit containing an IC chip because it is difficult that a driver circuit having a rapid operational speed is manufactured with the TFT using the amorphous silicon film.

Embodiment 5

In Embodiments 1 through 4, explanations were made in regards to the active matrix type EL light-emitting device. However, the present invention may also be implemented to an EL element of a passive matrix type EL light-emitting device.

The passive matrix type EL light-emitting device is formed containing a structure where anodes and cathodes are provided in stripe-shape such that they are orthogonal to each other and organic EL layers are sandwiched therebetween. The structure shown in FIG. 1 may be employed when manufacturing the passive matrix type EL light-emitting device.

Note that the constitution of Embodiment 5 may be implemented by freely combining it with any of the constitutions of Embodiments 1 to 3. However, in case of combining the constitution of Embodiment 5 with that of Embodiment 3, the driver circuit containing an IC chip is externally attached.

Embodiment 6

An example of employing the EL light-emitting device of the present invention as a light source of a backlight that is used in a liquid crystal display or fluorescent display lamp will be explained in Embodiment 6. In this case, there is no need to separate the EL elements according to the respective pixels. The El elements implemented by the present invention may be used as the luminous elements emitting light in a spread manner.

Further, in the surface of the substrate, the area thereof may be split into a plurality of areas such that the light emission of different colors can be obtained from the respective areas. The manufacturing process of the organic EL layer of Embodiment 1 may be referenced regarding the separate formation of the EL elements.

It is to be noted that the EL element of Embodiment 6 basically corresponds to the case where a pixel in Embodiment 1 has been formed to become large. Therefore, it is desirable that the contrivance of covering the edge portion of the anode with the insulating film is performed with reference to Embodiment 1.

Embodiment 7

The light-emitting device formed by implementing the present invention can be used as a display portion of various kinds of electric equipments. For instance, when appreciating a television broadcast or the like, a display incorporating a 20 to 60 inch diagonal light-emitting device of the present invention in a casing may be used. Note that a personal computer display, a television broadcast receiving display, and a display for exhibiting all information such as a display for displaying announcements are included in the displays having the light-emitting device incorporated in a casing.

The following can be given as other electronic equipments of the present invention: a video camera; a digital camera; a goggle type display (head mounted display); a navigation system; an audio playback device (such as a car audio stereo or an audio component stereo); a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium and displays the images). Specific examples of these electronic equipments are shown in FIGS. 8A to 9B.

FIG. 8A shows a display having a light-emitting device incorporated in a casing, and the display contains a casing 2001, a support stand 2002, a display portion 2003 and the like. The light-emitting device of the present invention can be used as the display portion 2003. Such a display is a self-emitting type so that a back light is not necessary. Thus, the display portion can be made thinner than that of a liquid crystal display.

FIG. 8B shows a video camera, and contains a main body 2101, a display portion 2102, a sound input portion 2103, operation switches 2104, a battery 2105, an image receiving portion 2106 and the like. The light-emitting device of the present invention can be used as the display portion 2102.

FIG. 8C is a portion (right side) of a head mounted EL display, and contains a main body 2201, a signal cable 2202, a head fixing band 2203, a display portion 2204, an optical system 2205, a light-emitting device 2206 and the like. The present invention can be applied to the self-emitting device 2206.

FIG. 8D is an image playback device equipped with a recording medium (specifically, a DVD playback device), and contains a main body 2301, a recording medium (such as a DVD) 2302, operation switches 2303, a display portion (a) 2304, a display portion (b) 2305 and the like. The display portion (a) 2304 is mainly used for displaying image information. The display portion (b) 2305 is mainly used for displaying character information. The light-emitting device of the present invention can be used as the display portion (a) 2304 and as the display portion (b) 2305. Note that the image playback device equipped with the recording medium includes devices such as household game machines.

FIG. 8E shows a mobile computer, and contains a main body 2401, a camera portion 2402, an image receiving portion 2403, operation switches 2404, a display portion 2405 and the like. The light-emitting device of the present invention can be used as the display portion 2405.

FIG. 8F is a personal computer, and contains a main body 2501, a casing 2502, a display portion 2503, a keyboard 2504 and the like. The light-emitting device of the present invention can be used as the display portion 2503.

Note that if the luminance increases in the future, then it will become possible to use the light-emitting device of the present invention in a front type or a rear type projector by expanding and projecting light containing output image information with a lens, an optical fiber or the like.

In addition, since the light-emitting device conserves power in the light emitting portion, it is preferable to display information so as to make the light emitting portion as small as possible. Consequently, when using the light-emitting device in a display portion mainly for character information, such as in a portable information terminal, in particular a portable telephone or an audio playback device, it is preferable to drive the light-emitting device so as to form character information by the light emitting portions while non-light emitting portions are set as background.

Figure 9A:
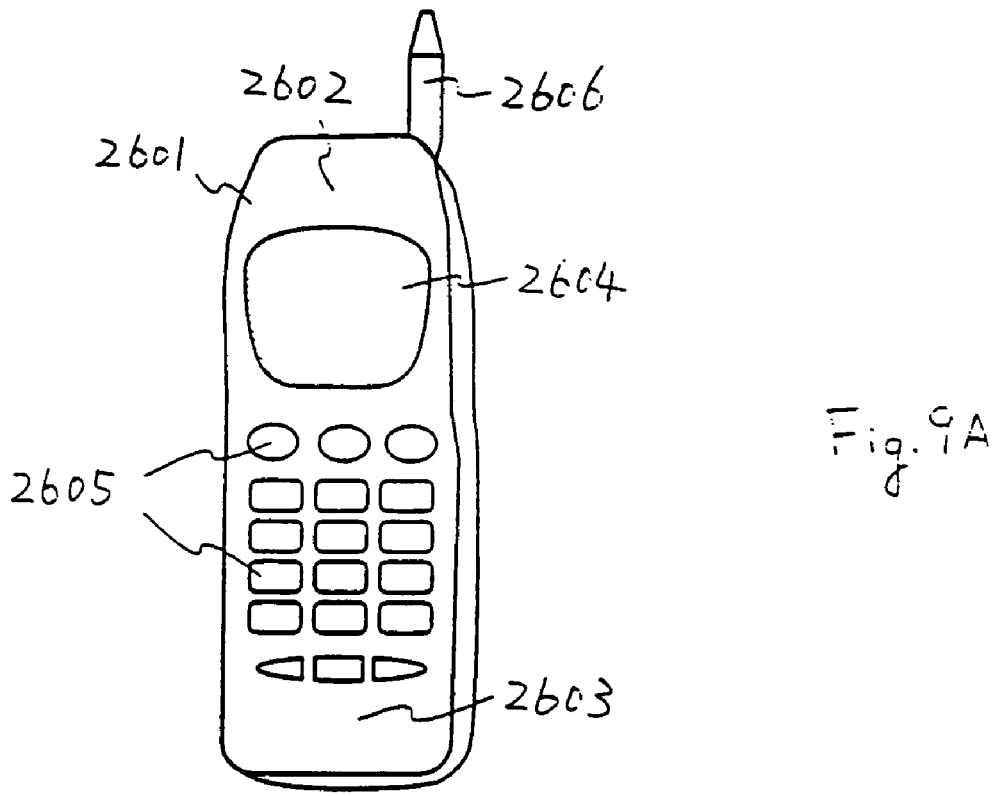
FIGS. 9A and 9B are diagrams showing specific examples of electronic equipments.

FIG. 9A shows a portable telephone, and contains a main body 2601, a sound output portion 2602, a sound input portion 2603, a display portion 2604, operation switches 2605, and an antenna 2606. The light-emitting device of the present invention can be used as the display portion 2604. Note that by displaying white color characters in a black color background, the display portion 2604 can suppress the power consumption of the portable telephone.

Figure 9B:
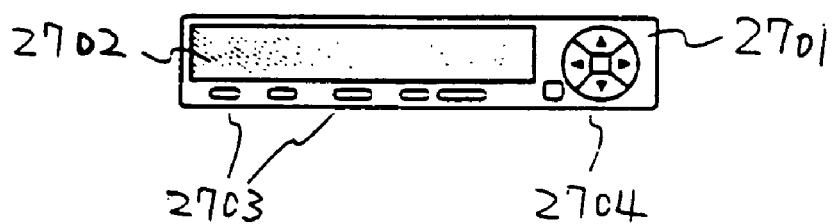

FIG. 9B shows an audio playback device, specifically a car audio stereo, and contains a main body 2701, a display portion 2702, and operation switches 2703 and 2704. The light-emitting device of the present invention can be used as the display portion 2702. Further, a car audio stereo is shown in Embodiment 7, but a portable type or a household audio playback device may also be used. Note that by displaying white color characters in a black color background, the display portion 2704 can suppress the power consumption. This is especially effective in a portable type audio playback device.

It is also possible to use the light-emitting device of the present invention as a light source for a back light of a liquid crystal display device (liquid crystal module). The liquid crystal display device, similar to the light-emitting device of the present invention, may be used as a display portion in all the above-mentioned electric equipments. The light-emitting device of the present invention can be provided in the electric equipments with the liquid crystal display device.

Thus, the application range of the present invention is extremely wide, whereby it may be employed in electric equipments of all fields. Further, the electric equipments of Embodiment 7 may employ the light-emitting device having any of the constitutions of Embodiments 1 through 6.

In the present invention, in the EL element composed of the anode, cathode, and the EL layer sandwiched therebetween, the cathode is made transparent to visible radiation and the reflecting electrode is provided under the EL element to thereby make it possible to extract light from the side of the cathode. As a result, the effect light emitting area of the pixel is improved sharply, whereby a bright emission of light can be obtained without raising the driving voltage of the EL elements.

Further, because the driving voltage can be reduced, suppression of the deterioration of the EL layer and reduction of the consumption power of the light-emitting device can be realized. In other words, it is possible to provide a bright and highly reliable light-emitting device. In addition, the reliability of the electric equipments using the light-emitting device of the present invention as the display portion or the light source can be improved.

What is claimed is:

1. A method for manufacturing a light emitting device comprising:
    forming a reflective film;
    forming an anode over said reflective film;
    forming an EL layer by an evaporation method using a shadow mask over said anode; and
    forming a cathode over said EL layer,
    wherein said cathode is transparent or semi-transparent with respect to a visible light.

2. A method for manufacturing a light emitting device according to claim 1,
    wherein said anode comprises an oxide conductive film which is transparent to a visible light.

3. A method for manufacturing a light emitting device according to claim 1, wherein said reflective film is formed to be electrically connected with a TFT.

4. A method for manufacturing a light emitting device according to claim 1, wherein the cathode comprises a metallic film.

5. A method for manufacturing a light emitting device according to claim 1, wherein the cathode has a film thickness of 10 to 70 nm.

6. A method for manufacturing a light emitting device comprising:
    forming a reflective film;
    forming an anode over said reflective film;
    forming an EL layer over said anode;
    forming a cathode over said EL layer; and
    forming an auxiliary electrode over said cathode.

7. A method for manufacturing a light emitting device according to claim 6,
    wherein said anode and said auxiliary electrode comprise an oxide conductive film which is transparent to a visible light; and
    wherein said cathode comprises a metallic film which is transparent to a visible light.

8. A method for manufacturing a light emitting device according to claim 6, wherein said reflective film is formed to be electrically connected with a TFT.

9. A method for manufacturing a light emitting device according to claim 6, wherein the cathode has a film thickness of 10 to 70 nm.

10. A method for manufacturing a light emitting device comprising:
    forming a reflective film;
    forming an anode over said reflective film;
    forming a light-emitting layer by an evaporation method using a shadow mask over said anode; and
    forming a cathode over said light-emitting layer,
    wherein said cathode is transparent or semi-transparent with respect to a visible light.

11. A method for manufacturing a light emitting device according to claim 10,
    wherein said anode comprises an oxide conductive film which is transparent to a visible light.

12. A method for manufacturing a light emitting device according to claim 10, wherein said reflective film is formed to be electrically connected with a TFT.

13. A method for manufacturing a light emitting device according to claim 10, wherein the cathode comprises a metallic film.

14. A method for manufacturing a light emitting device according to claim 10, wherein the cathode has a film thickness of 10 to 70 nm.

15. A method for manufacturing a light emitting device comprising:
    forming a reflective film;
    forming an anode over said reflective film;
    forming a light-emitting layer over said anode;
    forming a cathode over said light-emitting layer; and
    forming an auxiliary electrode over said cathode.

16. A method for manufacturing a light emitting device according to claim 15,
    wherein said anode and said auxiliary electrode comprise an oxide conductive film which is transparent to a visible light; and
    wherein said cathode comprises a metallic film which is transparent to a visible light.

17. A method for manufacturing a light emitting device according to claim 15, wherein said reflective film is formed to be electrically connected with a TFT.

18. A method for manufacturing a light emitting device according to claim 15, wherein the cathode has a film thickness of 10 to 70 nm.

* * * * *